United States Patent
Hori (10) Patent No.: US 10,337,119 B2
(45) Date of Patent: Jul. 2, 2019

(54) METHOD OF MANUFACTURING SILICON CARBIDE EPITAXIAL SUBSTRATE

(71) Applicant: Sumitomo Electric Industries, Ltd., Osaka-shi (JP)

(72) Inventor: Tsutomu Hori, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/743,950

(22) PCT Filed: Jul. 28, 2016

(86) PCT No.: PCT/JP2016/072142
§ 371 (c)(1),
(2) Date: Jan. 11, 2018

(87) PCT Pub. No.: WO2017/047245
PCT Pub. Date: Mar. 23, 2017

(65) Prior Publication Data
US 2018/0202068 A1    Jul. 19, 2018

(30) Foreign Application Priority Data
Sep. 14, 2015   (JP) .................. 2015-180673

(51) Int. Cl.
| C30B 25/04 | (2006.01) |
| C30B 25/10 | (2006.01) |
| C30B 29/36 | (2006.01) |
| H01L 21/02 | (2006.01) |
| C30B 25/16 | (2006.01) |
| C30B 25/20 | (2006.01) |

(52) U.S. Cl.
CPC ............ *C30B 25/10* (2013.01); *C30B 25/165* (2013.01); *C30B 25/20* (2013.01); *C30B 29/36* (2013.01); *H01L 21/0262* (2013.01); *H01L 21/02378* (2013.01); *H01L 21/02529* (2013.01); *H01L 21/02576* (2013.01)

(58) Field of Classification Search
CPC ......... C30B 25/02; C30B 25/04; C30B 25/14; C30B 29/36
See application file for complete search history.

(56) References Cited

U.S. PATENT DOCUMENTS 6,470,144 B1 * 10/2002 Tarutani .............. C23C 16/4486
118/724
2002/0061605 A1 * 5/2002 Hasegawa ........... C23C 16/4401
438/5
(Continued)

FOREIGN PATENT DOCUMENTS

JP       2003-086518 A      3/2003

*Primary Examiner* — Robert M Kunemund
(74) *Attorney, Agent, or Firm* — Baker Botts L.L.P.; Michael A. Sartori (57) ABSTRACT

A method of manufacturing a silicon carbide epitaxial substrate includes: performing degassing by heating a reaction chamber of a film formation apparatus; and using a gas including silicon atoms, a gas including carbon atoms, an ammonia gas, and a hydrogen gas serving as a carrier gas and having a dew point equal to or less than −100° C., epitaxially growing a silicon carbide layer on a surface of a silicon carbide single-crystal substrate within the reaction chamber.

7 Claims, 5 Drawing Sheets

(56) References Cited

U.S. PATENT DOCUMENTS

| | | | |
|---|---|---|---|
| 2008/0227256 A1* | 9/2008 | Tanimoto | H01L 21/0485 438/285 |
| 2010/0276703 A1* | 11/2010 | Tanimoto | H01L 21/0485 257/77 |
| 2013/0071643 A1* | 3/2013 | Harada | C30B 23/005 428/220 |
| 2017/0335486 A1* | 11/2017 | Harada | C23C 14/24 |

* cited by examiner

METHOD OF MANUFACTURING SILICON CARBIDE EPITAXIAL SUBSTRATE

TECHNICAL FIELD

The present disclosure relates to methods of manufacturing silicon carbide epitaxial substrates.

This application claims priority to Japanese Patent Application No. 2015-180673 filed on Sep. 14, 2015, which is incorporated herein by reference in its entirety.

BACKGROUND ART

Japanese Patent Laying-Open No. 2003-86518 (PTD 1) discloses a CVD (Chemical Vapor Deposition) method, a CVD device and a susceptor for the CVD device, for a silicon carbide layer.

CITATION LIST

Patent Document

PTD 1: Japanese Patent Laying-Open No. 2003-86518

SUMMARY OF INVENTION

A method of manufacturing a silicon carbide epitaxial substrate according to the present disclosure includes: performing degassing by heating a reaction chamber of a film formation apparatus; and using a gas including silicon atoms, a gas including carbon atoms, an ammonia gas, and a hydrogen gas serving as a carrier gas and having a dew point equal to or less than −100° C., epitaxially growing a silicon carbide layer on a surface of a silicon carbide single-crystal substrate within the reaction chamber.

DESCRIPTION OF EMBODIMENTS

Description of Embodiment (1) A method of manufacturing a silicon carbide epitaxial substrate of a silicon carbide layer according to the present disclosure includes: performing degassing by heating a reaction chamber of a film formation apparatus; and using a gas including silicon atoms, a gas including carbon atoms, an ammonia gas, and a hydrogen gas serving as a carrier gas and having a dew point equal to or less than −100° C., epitaxially growing a silicon carbide layer on a surface of a silicon carbide single-crystal substrate within the reaction chamber.

By the gas having the gas including silicon atoms, the gas including carbon atoms and the ammonia gas, the silicon carbide layer doped with an impurity of nitrogen (N) is formed on the surface of the silicon carbide single-crystal substrate. A nitrogen atom is generated by ammonia decomposition. Ammonia tends to react with water. The reaction of ammonia and water tends to hinder thermal decomposition of ammonia. By performing the degassing by heating the reaction chamber of the film formation apparatus, water adsorbed into the reaction chamber can be released to the outside of the reaction chamber. In addition, since the carrier gas has a low dew point, the amount of water included per unit volume of the gas can be reduced. The amount of water present in the reaction chamber can thus be reduced during the epitaxial growth of silicon carbide, thereby facilitating the thermal decomposition of ammonia. Accordingly, the silicon carbide layer having excellent in-plane uniformity of doping density can be formed.

(2) The method of manufacturing a silicon carbide epitaxial substrate according to (1) above may further include introducing an inert gas into the reaction chamber under normal temperature, and then exhausting the inert gas from the reaction chamber. The introducing and exhausting of the inert gas may be performed prior to the performing of degassing.

The "normal temperature" may be defined as a temperature of the reaction chamber when the reaction chamber is not being heated or cooled.

(3) In the method of manufacturing a silicon carbide epitaxial substrate according to (2) above, the inert gas may be an argon gas having a dew point equal to or less than −95° C. In the introducing and exhausting of the inert gas, the argon gas may be introduced into the reaction chamber until a pressure in the reaction chamber reaches a pressure equal to or greater than 2×10$^4$ Pa, and then a vacuum may be generated within the reaction chamber until the pressure in the reaction chamber reaches a pressure equal to or less than 1×10$^{-4}$ Pa.

(4) In the method of manufacturing a silicon carbide epitaxial substrate according to any one of (1) to (3) above, the performing of degassing may include heating the reaction chamber to a temperature equal to or greater than 1000° C., and generating a vacuum until the pressure in the reaction chamber reaches a pressure equal to or less than 0.01 Pa.

(5) In the method of manufacturing a silicon carbide epitaxial substrate according to any one of (1) to (4) above, the silicon carbide single-crystal substrate may have a diameter equal to or greater than 100 mm.

(6) In the method of manufacturing a silicon carbide epitaxial substrate according to any one of (1) to (4) above, the silicon carbide single-crystal substrate may have a diameter equal to or greater than 150 mm.

(7) A method of manufacturing a silicon carbide epitaxial substrate of a silicon carbide layer according to the present disclosure includes: introducing an inert gas into a reaction chamber of a film formation apparatus under normal temperature, and then exhausting the inert gas from the reaction chamber; after the exhausting of the inert gas, performing degassing by heating the reaction chamber; and using a gas including silicon atoms, a gas including carbon atoms, an ammonia gas, and a hydrogen gas serving as a carrier gas and having a dew point equal to or less than −100° C., epitaxially growing a silicon carbide layer on a surface of a silicon carbide single-crystal substrate within the reaction chamber. The inert gas is an argon gas having a dew point equal to or less than −95° C. In the introducing and exhausting of the inert gas, the argon gas is introduced into the reaction chamber until a pressure in the reaction chamber reaches a pressure equal to or greater than $2 \times 10^4$ Pa, and then a vacuum is generated within the reaction chamber until the pressure in the reaction chamber reaches a pressure equal to or less than $1 \times 10^{-4}$ Pa. The performing of degassing includes heating the reaction chamber to a temperature equal to or greater than 1000° C., and generating a vacuum until the pressure in the reaction chamber reaches a pressure equal to or less than 0.01 Pa. The silicon carbide single-crystal substrate has a diameter equal to or greater than 150 mm.

Details of Embodiment

An embodiment will be described below based on the drawings. In the following drawings, the same or corresponding parts are designated by the same reference numbers and description thereof will not be repeated. An individual plane and a group plane are herein shown in ( ) and { }, respectively. Although a crystallographically negative index is normally expressed by a number with a bar "−" thereabove, a negative sign herein precedes a number to indicate a crystallographically negative index.

Figure 1:
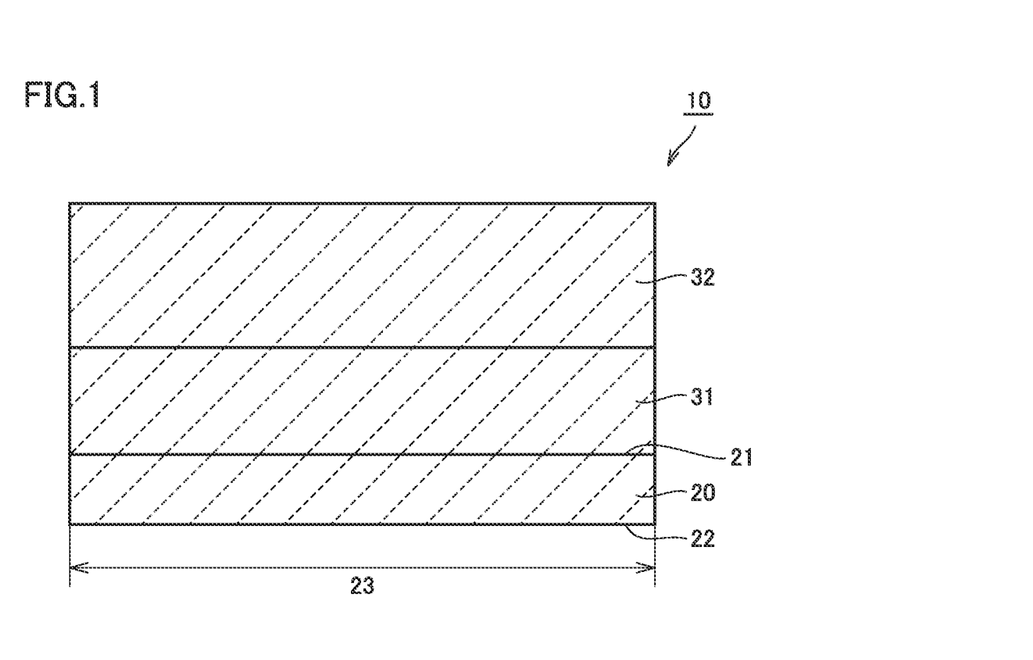
FIG. 1 is a schematic sectional view showing the configuration of a silicon carbide epitaxial substrate according to the present embodiment.

FIG. 1 is a schematic sectional view showing the configuration of a silicon carbide epitaxial substrate according to the present embodiment. As shown in FIG. 1, a silicon carbide epitaxial substrate 10 includes a silicon carbide single-crystal substrate 20, a silicon carbide layer 31, and a silicon carbide layer 32.

Silicon carbide single-crystal substrate 20 is made of hexagonal silicon carbide having a polytype of 4H, for example. Silicon carbide single-crystal substrate 20 has a frontside surface 21 and a backside surface 22. A maximum diameter 23 of frontside surface 21 and backside surface 22 is equal to or greater than 100 mm, for example. Maximum diameter 23 may be equal to or greater than 150 mm.

Silicon carbide single-crystal substrate 20, silicon carbide layer 31, and silicon carbide layer 32 include nitrogen as an n type impurity. In one example, the concentration of the n type impurity in silicon carbide single-crystal substrate 20 is higher than the concentration of the n type impurity in silicon carbide layer 31. The concentration of the n type impurity in silicon carbide layer 31 is higher than the concentration of the n type impurity in silicon carbide layer 32.

The concentration of the n type impurity in silicon carbide single-crystal substrate 20 is $1 \times 10^{19}$ cm$^{-3}$, for example. The concentration of the n type impurity in silicon carbide layer 31 is $1 \times 10^{18}$ cm$^{-3}$. The concentration of the n type impurity in silicon carbide layer 32 is equal to or greater than $1 \times 10^{15}$ cm$^{-3}$ and equal to or less than $2 \times 10^{16}$ cm$^{-3}$, for example.

Silicon carbide single-crystal substrate 20 has a thickness equal to or greater than 300 μm and equal to or less than 600 μm, for example. Silicon carbide layer 31 has a thickness equal to or greater than 0.1 μm and equal to or less than 20 μm, for example. Silicon carbide layer 32 may have a thickness greater than the thickness of silicon carbide layer 31. Silicon carbide layer 32 has a thickness equal to or greater than 1 μm and equal to or less than 150 μm, for example.

Figure 2:
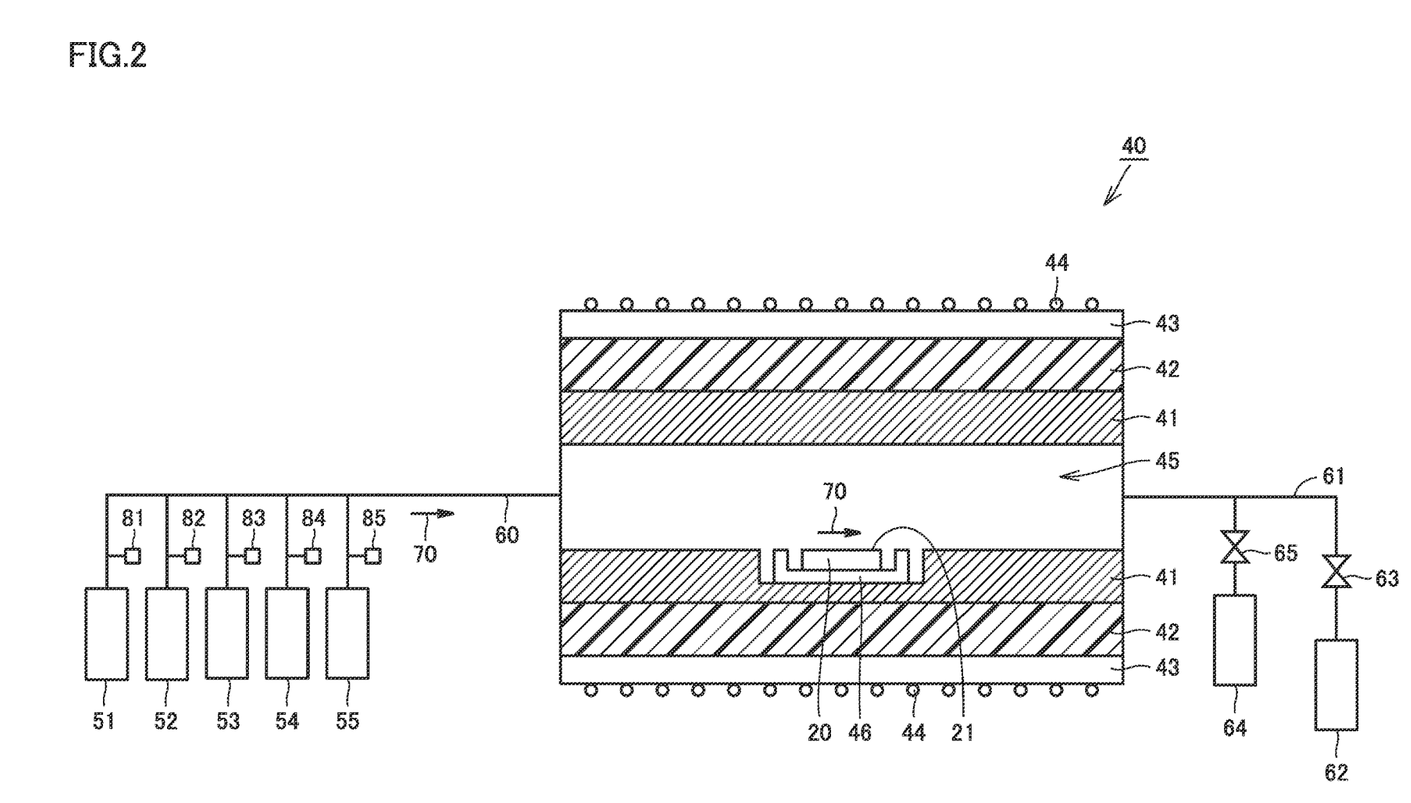
FIG. 2 is a partial schematic sectional view showing the configuration of a film formation apparatus for performing a method of manufacturing the silicon carbide epitaxial substrate according to the present embodiment.

FIG. 2 is a partial schematic sectional view showing the configuration of a film formation apparatus 40 for performing a method of manufacturing the silicon carbide epitaxial substrate according to the present embodiment. Film formation apparatus 40 is a CVD (Chemical Vapor Deposition) apparatus, for example. As shown in FIG. 2, film formation apparatus 40 mainly has a quartz tube 43, an induction heating coil 44, a heat insulator 42, a heating element 41, a substrate holder 46, gas supply sources 51 to 55, pipes 60, 61, a gas exhaust pump 62, a mass spectrometer 64, valves 63, 65, and dew point meters 81 to 85.

Heating element 41 has a hollow structure, and forms a reaction chamber 45 therein. Heat insulator 42 is disposed to surround the outer circumference of heating element 41. Quartz tube 43 is disposed to surround the outer circumference of heat insulator 42. Induction heating coil 44 is provided such that it is wound around the outer circumference of quartz tube 43.

Substrate holder 46 is placed within reaction chamber 45. Substrate holder 46 is a support member configured to be able to hold silicon carbide single-crystal substrate 20. In one example, substrate holder 46 is a susceptor.

Gas supply source 51 supplies a hydrogen (H$_2$) gas as a carrier gas. Gas supply sources 52 and 53 each supply a source material gas. Gas supply source 52 supplies a gas including silicon (Si) atoms. Gas supply source 53 supplies a gas including carbon (C) atoms.

The gas including silicon atoms may be a silane (SiH$_4$) gas. Other examples of the gas including silicon atoms may include a silicon tetrachloride (SiCl$_4$) gas, a trichlorosilane (SiHCl$_3$) gas, and a dichlorosilane (SiH$_2$Cl$_2$) gas. The gas including carbon atoms may be a propane (C$_3$H$_8$) gas.

Gas supply source 54 supplies an ammonia (NH$_3$) gas as a dopant gas. Gas supply source 55 supplies an inert gas as a purge gas. Examples of the inert gas may include an argon (Ar) gas and a neon (Ne) gas.

Each of gas supply sources 51 to 55 may include a gas purification device. The gas purification device can lower the dew point of a gas.

In an example described below, the gas including silicon (Si) atoms is a silane gas. The gas including carbon atoms is a propane (C$_3$H$_8$) gas. The inert gas is an argon (Ar) gas.

Pipe 60 is configured to introduce a gas 70 into reaction chamber 45. During epitaxial growth of silicon carbide, a mixed gas of the carrier gas, the source material gas and the dopant gas is supplied as gas 70 into reaction chamber 45. When purging reaction chamber 45, an argon gas is supplied as gas 70.

Pipe 61 is configured to exhaust the gas from reaction chamber 45. Gas exhaust pump 62 is connected to pipe 61. Valve 63 is provided on pipe 61 for adjusting a gas exhaust flow rate, for example. Mass spectrometer 64 is attached to pipe 61 through valve 65.

Dew point meters 81 to 85 measure the dew points of the gases supplied from gas supply sources 51 to 55, respectively. Dew points described below are values measured by dew point meters 81 to 85.

Figure 3:
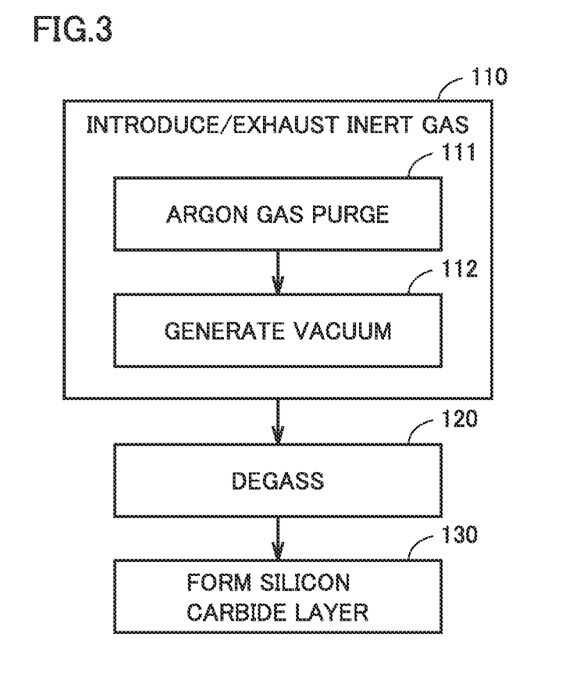
FIG. 3 is a flowchart schematically showing the method of manufacturing the silicon carbide epitaxial substrate according to the present embodiment.

FIG. 3 is a flowchart schematically showing the method of manufacturing the silicon carbide epitaxial substrate according to the present embodiment. The method of manufacturing the silicon carbide epitaxial substrate according to the present embodiment is performed using film formation apparatus 40 shown in FIG. 2. The flow shown in FIG. 3 may be applied to either one or both of silicon carbide layers 31 and 32.

As shown in FIG. 3, first, a step 110 is performed under normal temperature. The "normal temperature" can be a temperature of reaction chamber 45 when reaction chamber 45 is not being heated or cooled. The "normal temperature" may be room temperature, for example.

Step 110 includes a step 111 and a step 112. In step 111, the inside of reaction chamber 45 is purged by an argon gas. In one example, the argon gas is introduced from gas supply source 55 into reaction chamber 45 while valves 63 and 65 are closed. The argon gas has a dew point equal to or less than −95° C.

In step 112, valve 63 is opened. A vacuum is generated in reaction chamber 45 by gas exhaust pump 62. Valve 65 may be opened, causing mass spectrometer 64 to detect a component of the gas exhausted from reaction chamber 45. Mass spectrometer 64 can detect that water is discharged from reaction chamber 45.

Step 111 and step 112 are each performed at least once. Thus, step 111 and step 112 may be performed repeatedly.

Next, degassing is performed in a step 120. Reaction chamber 45 is heated, and a vacuum is generated within reaction chamber 45 by gas exhaust pump 62. A high-frequency current is passed through induction heating coil 44, to inductively heat heating element 41. Reaction chamber 45 is thereby heated. With the generation of a vacuum within reaction chamber 45 by gas exhaust pump 62, gas molecules and water are desorbed from the wall of reaction chamber 45. Accordingly, the amount of water present in reaction chamber 45 can be reduced.

Subsequently, in a step 130, silicon carbide layer 31 is formed on silicon carbide single-crystal substrate 20 by epitaxial growth. Alternatively, silicon carbide layer 32 is formed on silicon carbide layer 31. Silicon carbide layers 31 and 32 can be successively formed, for example.

Figure 4:
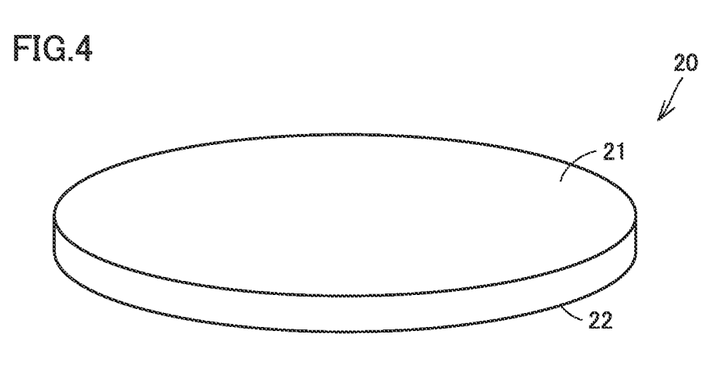
FIG. 4 is a schematic perspective view showing an example of a silicon carbide single-crystal substrate.

Silicon carbide single-crystal substrate 20 is introduced into reaction chamber 45 prior to step 130. Silicon carbide single-crystal substrate 20 having frontside surface 21 and backside surface 22 is prepared, as shown in FIG. 4. Silicon carbide single-crystal substrate 20 is fabricated by slicing an ingot made of silicon carbide single crystal manufactured by sublimation, for example. Frontside surface 21 is a plane inclined by an off angle relative to a basal plane. The basal plane is a {0001} plane, for example, and specifically a (0001) Si face. The off angle is equal to or greater than 2° and equal to or less than 8°, for example. The off direction may be a <1-100> direction or a <11-20> direction.

As shown in FIG. 2, silicon carbide single-crystal substrate 20 is placed on substrate holder 46. As reaction chamber 45 is heated, the temperatures of silicon carbide single-crystal substrate 20 and the inside of the reaction chamber rise. When the temperatures of reaction chamber 45 and silicon carbide single-crystal substrate 20 reach a growth temperature, gas 70 having a mixture of the hydrogen gas, the source material gas including silane and propane, and the dopant gas (ammonia gas) is introduced into reaction chamber 45. The source material gas and the dopant gas each have a dew point equal to or less than −100° C., for example, which is similar to that of the hydrogen gas. In order to facilitate the thermal decomposition of ammonia, gas 70 may be heated before being introduced into reaction chamber 45. In this manner, silicon carbide layers 31 and 32 are formed on silicon carbide single-crystal substrate 20 by epitaxial growth.

Figure 5:
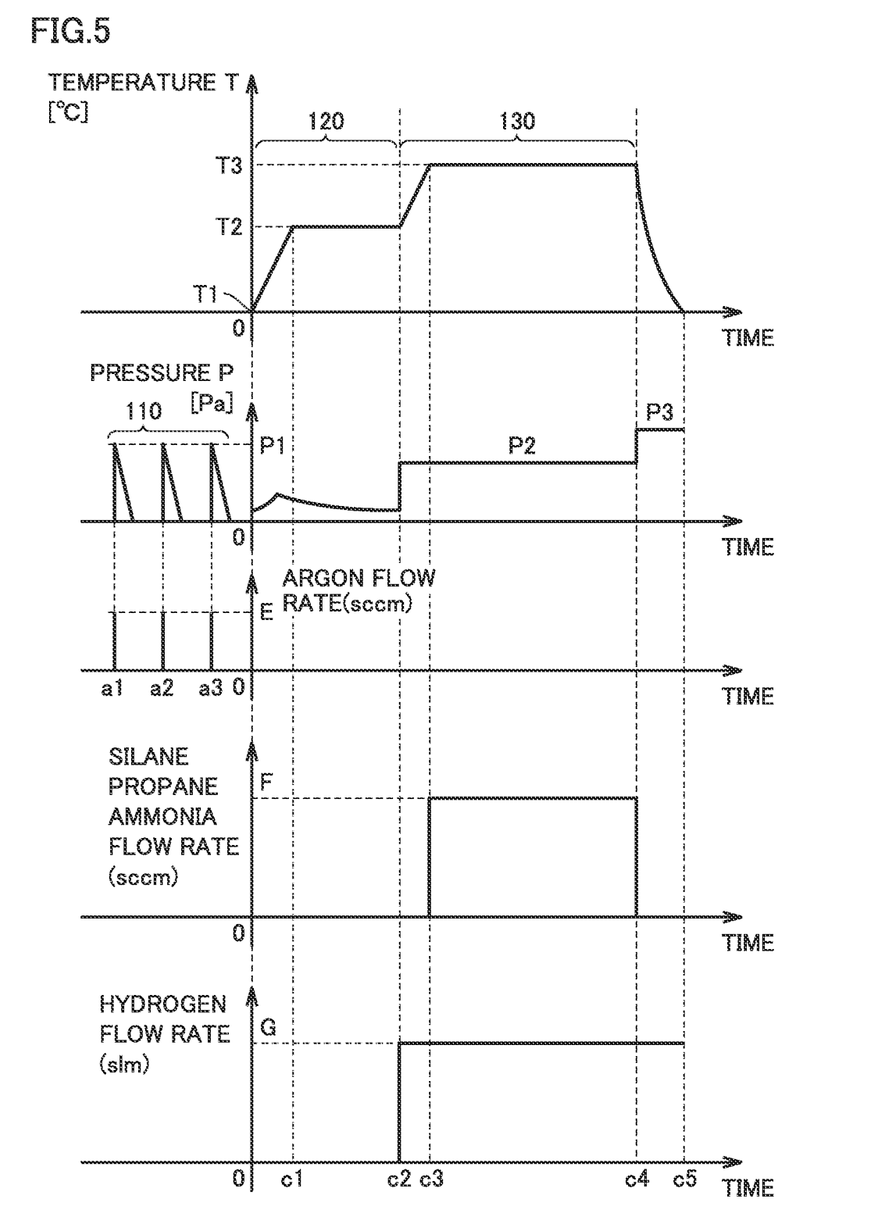
FIG. 5 is a graph illustrating each step shown in FIG. 2.

FIG. 5 is a graph illustrating each step shown in FIG. 2. Temporal variations in a temperature T and a pressure P in reaction chamber 45 are shown in FIG. 5. Temporal variations in flow rates of the gases in steps 110 to 130 are also shown. The beginning of step 120 is indicated by "0".

In step 110, an argon gas is introduced into reaction chamber 45 at a temperature T1, and then a vacuum is generated within reaction chamber 45. Temperature T1 is normal temperature. A flow rate of the argon gas is E (sccm).

The introduction of the argon gas into reaction chamber 45 and the exhaust of the argon gas from reaction chamber 45 may be repeated. For example, the argon gas is introduced into reaction chamber 45 at times a1, a2 and a3. The introduction of the argon gas causes pressure P to reach P1. Pressure P1 is equal to or greater than $2 \times 10^4$ (Pa), for example. The vacuum generation causes pressure P to reach a pressure equal to or less than $1 \times 10^{-4}$ Pa.

In step 120, reaction chamber 45 is heated and degassing is performed. Temperature T of reaction chamber 45 rises from T1. Gas molecules or water are desorbed from the wall of reaction chamber 45, causing a temporary rise in pressure P. Since the gas exhaust is continued, pressure P falls again after the rise.

At a time c1, temperature T reaches T2. T2 is a prescribed temperature equal to or greater than 1000° C. Temperature T is maintained at T2 until a time c2. A vacuum is generated within reaction chamber 45 until the pressure in reaction chamber 45 reaches a pressure equal to or less than 0.01 Pa.

At time c2, step 130 is started. A hydrogen gas having a dew point equal to or less than −100° C. is supplied into reaction chamber 45. A flow rate of the hydrogen gas is G (slm). The supply of the hydrogen gas causes pressure P to rise to P2 (Pa).

At time c2, temperature T rises from T2. At a time c3, temperature T reaches T3. Temperature T3 is equal to or greater than 1500° C. and equal to or less than 1700° C., for example. At time c3, a mixed gas of a silane gas, a propane gas, an ammonia gas and a hydrogen gas is introduced into reaction chamber 45. The total flow rate of the silane gas, the propane gas and the ammonia gas is F (sccm). The flow rate of the hydrogen gas may remain G (slm). Pressure P is maintained at P2 (Pa).

At a time c4, step 130 ends. The supply of the silane gas, the propane gas and the ammonia gas is stopped. The supply of the hydrogen gas may be continued beyond time c4 in order to cool reaction chamber 45. Temperature T falls and reaches normal temperature at a time c5.

In step 110, an inert gas is introduced into reaction chamber 45. The inert gas is then exhausted from reaction chamber 45. The amount of water present in reaction chamber 45 can thereby be reduced. In step 120, water that has been adsorbed into reaction chamber 45 can be discharged to the outside of reaction chamber 45. Step 110 may be omitted.

In step 130, by using the gas having a low dew point, the amount of water included per unit volume of the gas can be reduced. With the reduction in the amount of water in reaction chamber 45, the thermal decomposition of ammonia can be facilitated during epitaxial growth of silicon carbide. As a result, in-plane uniformity of doping density in the silicon carbide layer can be improved.

Figure 6:
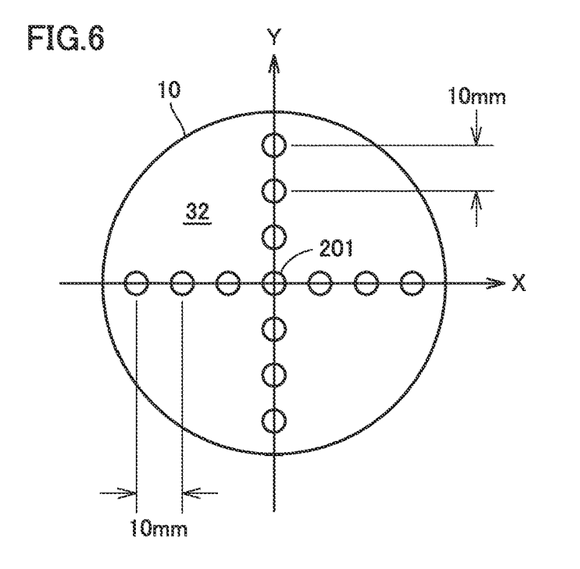
FIG. 6 is a diagram illustrating a silicon carbide epitaxial substrate having a diameter of 100 mm formed with the method of manufacturing the silicon carbide epitaxial substrate according to the present embodiment.

FIG. 6 is a diagram illustrating a silicon carbide epitaxial substrate having a diameter of 100 mm formed with the method of manufacturing the silicon carbide epitaxial substrate according to the present embodiment. As shown in FIG. 6, measurement points 201 are located at intervals of 10 mm on the surface of silicon carbide epitaxial substrate 10 (silicon carbide layer 32). Although there are 17 measurement points 201, only 13 of them are shown in FIG. 6. Assuming that the coordinates of the center of a wafer are (0 mm, 0 mm), the coordinates of the 17 measurement points can be expressed as follows:

(0 mm, −40 mm), (0 mm, −30 mm), (0 mm, −20 mm), (0 mm, −10 mm), (0 mm, 0 mm), (0 mm, 10 mm), (0 mm, 20 mm), (0 mm, 30 mm), (0 mm, 40 mm), (−40 mm, 0 mm), (−30 mm, 0 mm), (−20 mm, 0 mm), (−10 mm, 0 mm), (10 mm, 0 mm), (20 mm, 0 mm), (30 mm, 0 mm), (40 mm, 0 mm)

Silicon carbide layer 32 is formed under the following conditions, for example. The epitaxial growth temperature (T3) is 1600° C. The epitaxial growth pressure (P2) is $1\times10^4$ Pa. The flow rate of the silane gas is 46 sccm. The flow rate of the propane gas is 17 sccm. The flow rate of the ammonia gas is 0.16 sccm. The dew point of the argon gas is −100° C. The flow rate of the hydrogen gas is 120 slm. The dew point of the hydrogen gas is −110° C.

The doping density (Nd—Na) can be obtained with a capacitance-voltage measurement method. The in-plane uniformity of the doping density is determined from measured values of the doping density at 17 measurement points 201. Assuming that the standard deviation of the measured values is σ and the mean value of the measured values is m, the in-plane uniformity is expressed as σ/m: a value obtained by dividing σ by m.

The doping density in silicon carbide layer 32 formed under the above conditions is $2.7\times10^{15}$ cm$^{-3}$. The in-plane uniformity of the doping density in silicon carbide layer 32 is 1.8%. It can be said that an in-plane uniformity of 1.8% is desirable for a silicon carbide semiconductor substrate having a diameter of 100 mm.

Figure 7:
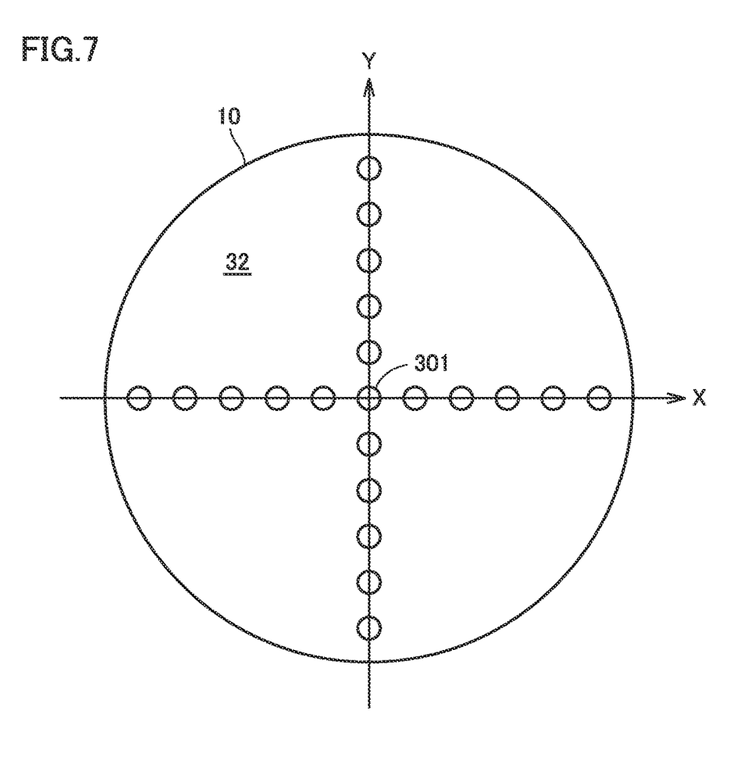
FIG. 7 is a diagram illustrating a silicon carbide epitaxial substrate having a diameter of 150 mm formed with the method of manufacturing the silicon carbide epitaxial substrate according to the present embodiment.

FIG. 7 is a diagram illustrating a silicon carbide epitaxial substrate having a diameter of 150 mm formed with the method of manufacturing the silicon carbide epitaxial substrate according to the present embodiment. As shown in FIG. 7, measurement points 301 are located at intervals of 10 mm on the surface of silicon carbide epitaxial substrate 10 (silicon carbide layer 32). Although there are 29 measurement points 301, only 21 of them are schematically shown in FIG. 7. Assuming that the coordinates of the center of a wafer are (0 mm, 0 mm), the coordinates of the 29 measurement points can be expressed as follows:

(0 mm, −70 mm), (0 mm, −60 m), (0 mm, −50 mm), (0 mm, −40 mm), (0 mm, −30 mm), (0 mm, −20 mm), (0 mm, −10 mm), (0 mm, 0 mm), (0 mm, 10 mm), (0 mm, 20 mm), (0 mm, 30 mm), (0 mm, 40 mm), (0 mm, 50 mm), (0 mm, 60 mm), (0 mm, 70 mm), (−70 mm, 0 mm), (−60 mm, 0 mm), (−50 mm, 0 mm), (−40 mm, 0 mm), (−30 mm, 0 mm), (−20 mm, 0 mm), (−10 mm, 0 mm), (10 mm, 0 mm), (20 mm, 0 mm), (30 mm, 0 mm), (40 mm, 0 mm), (50 mm, 0 mm), (60 mm, 0 mm), (70 mm, 0 mm)

Silicon carbide layer 32 is formed under the following conditions, for example. The epitaxial growth temperature (T3) is 1600° C. The epitaxial growth pressure (P2) is $1\times10^4$ Pa. The flow rate of the silane gas is 46 sccm. The flow rate of the propane gas is 17 sccm. The flow rate of the ammonia gas is 0.17 sccm. The dew point of the argon gas is −100° C. The flow rate of the hydrogen gas is 120 slm. The dew point of the hydrogen gas is −110° C.

The doping density (Nd—Na) can be obtained with a capacitance-voltage measurement method. Under the above conditions, the doping density in silicon carbide layer 32 is $2.8\times10^{15}$ cm$^{-3}$. The in-plane uniformity of the doping density in silicon carbide layer 32 is 3.9%. It can be said that an in-plane uniformity of 3.9% of the doping density is desirable for a silicon carbide semiconductor substrate having a diameter of 150 mm.

It should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

REFERENCE SIGNS LIST 10 silicon carbide epitaxial substrate; 20 silicon carbide single-crystal substrate; 21 frontside surface; 22 backside surface; 23 maximum diameter; 31, 32 silicon carbide layer; 40 film formation apparatus; 41 heating element; 42 heat insulator; 43 quartz tube; 44 induction heating coil; 45 reaction chamber; 46 substrate holder; 51 to 55 gas supply source; 60, 61 pipe; 62 gas exhaust pump; 63, 65 valve; 64 mass spectrometer; 70 gas; 81 to 85 dew point meter; 110, 111, 112, 120, 130 step; 201, 301 measurement point; P, P1, P2 pressure; T, T1, T2, T3 temperature; E, F, G flow rate; a1 to a3, c1 to c5 time.

The invention claimed is:

1. A method of manufacturing a silicon carbide epitaxial substrate, comprising:
   performing degassing by heating a reaction chamber of a chemical vapor deposition (CVD) apparatus; and
   using a silane gas, a propane gas, an ammonia gas, and a hydrogen gas serving as a carrier gas and having a dew point equal to or less than −100° C., epitaxially growing a silicon carbide layer on a surface of a silicon carbide single-crystal substrate within the reaction chamber.

2. The method of manufacturing a silicon carbide epitaxial substrate according to claim 1, further comprising introducing an inert gas into the reaction chamber under normal temperature, and then exhausting the inert gas from the reaction chamber, wherein
   the introducing and exhausting of the inert gas is performed prior to the performing of degassing.

3. The method of manufacturing a silicon carbide epitaxial substrate according to claim 2, wherein
   the inert gas is an argon gas having a dew point equal to or less than −95° C., and
   in the introducing and exhausting of the inert gas, the argon gas is introduced into the reaction chamber until a pressure in the reaction chamber reaches a pressure equal to or greater than $2\times10^4$ Pa, and then a vacuum is generated within the reaction chamber until the pressure in the reaction chamber reaches a pressure equal to or less than $1\times10^{-4}$ Pa.

4. The method of manufacturing a silicon carbide epitaxial substrate according to claim 1, wherein
   the performing of degassing includes heating the reaction chamber to a temperature equal to or greater than 1000° C., and generating a vacuum until the pressure in the reaction chamber reaches a pressure equal to or less than 0.01 Pa.

5. The method of manufacturing a silicon carbide epitaxial substrate according to claim 1, wherein
   the silicon carbide single-crystal substrate has a diameter equal to or greater than 100 mm.

6. The method of manufacturing a silicon carbide epitaxial substrate according to claim 1, wherein
   the silicon carbide single-crystal substrate has a diameter equal to or greater than 150 mm.

7. A method of manufacturing a silicon carbide epitaxial substrate, comprising:
   introducing an inert gas into a reaction chamber of a film formation apparatus under normal temperature, and then exhausting the inert gas from the reaction chamber;

after the exhausting of the inert gas, performing degassing by heating the reaction chamber; and using a gas including silicon atoms, a gas including carbon atoms, an ammonia gas, and a hydrogen gas serving as a carrier gas and having a dew point equal to or less than −100° C., epitaxially growing a silicon carbide layer on a surface of a silicon carbide single-crystal substrate within the reaction chamber, the inert gas being an argon gas having a dew point equal to or less than −95° C., in the introducing and exhausting of the inert gas, the argon gas being introduced into the reaction chamber until a pressure in the reaction chamber reaches a pressure equal to or greater than $2\times10^4$ Pa, and then a vacuum being generated within the reaction chamber until the pressure in the reaction chamber reaches a pressure equal to or less than $1\times10^{-4}$ Pa, the performing of degassing including heating the reaction chamber to a temperature equal to or greater than 1000° C., and generating a vacuum until the pressure in the reaction chamber reaches a pressure equal to or less than 0.01 Pa, the silicon carbide single-crystal substrate having a diameter equal to or greater than 150 mm.

* * * * *